United States Patent
Tamatsuka et al.

(10) Patent No.: US 6,413,310 B1
(45) Date of Patent: Jul. 2, 2002

(54) METHOD FOR PRODUCING SILICON SINGLE CRYSTAL WAFER AND SILICON SINGLE CRYSTAL WAFER

(75) Inventors: Masaro Tamatsuka; Norihiro Kobayashi; Shoji Akiyama; Masaru Shinomiya, all of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/529,869

(22) PCT Filed: Aug. 27, 1999

(86) PCT No.: PCT/JP99/04651
§ 371 (c)(1),
(2), (4) Date: Apr. 20, 2000

(87) PCT Pub. No.: WO00/12786
PCT Pub. Date: Mar. 9, 2000

(30) Foreign Application Priority Data

Aug. 31, 1998 (JP) ............................................. 10-260845

(51) Int. Cl.[7] .............................. C21D 1/00; B32B 15/00
(52) U.S. Cl. ............................. 117/3; 117/906; 428/641
(58) Field of Search ...................... 117/3, 906; 423/348; 428/641; 432/17

(56) References Cited

U.S. PATENT DOCUMENTS

| 4,597,804 A | * | 7/1986 | Imaoka | 148/1.5 |
| 4,661,166 A | * | 4/1987 | Hirao | 148/1.5 |
| 4,851,358 A | * | 7/1989 | Huber | 437/10 |
| 5,401,669 A | * | 3/1995 | Falster et al. | 437/12 |
| 5,502,331 A | * | 3/1996 | Inoue et al. | 257/617 |
| 5,834,322 A | * | 11/1998 | Fusegawa et al. | 438/12 |
| 5,931,662 A | * | 8/1999 | Adachi et al. | 432/6 |
| 6,074,479 A | * | 6/2000 | Adachi et al. | 117/204 |
| 6,129,787 A | * | 10/2000 | Adachi et al. | 117/89 |
| 6,143,071 A | * | 11/2000 | Aihara et al. | 117/89 |
| 6,204,152 B1 | * | 3/2001 | Falster et al. | 438/473 |
| 6,204,188 B1 | * | 3/2001 | Abe et al. | 438/706 |
| 6,221,741 B1 | * | 4/2001 | Hamada | 438/476 |
| 6,245,311 B1 | * | 6/2001 | Kobayashi et al. | 423/348 |
| 6,261,361 B1 | * | 7/2001 | Iida et al. | 117/19 |
| 6,261,860 B1 | * | 7/2001 | Nagata | 438/58 |
| 6,277,193 B1 | * | 8/2001 | Sadamitsu et al. | 117/88 |
| 6,277,501 B1 | * | 8/2001 | Fujikawa | 428/641 |
| 6,277,715 B1 | * | 8/2001 | Takeno et al. | 438/492 |
| 6,284,384 B1 | * | 9/2001 | Wilson et al. | 428/450 |

FOREIGN PATENT DOCUMENTS

| DE | 199 00 091 A1 | 8/1999 |
| JP | 11-260677 | 9/1999 |

OTHER PUBLICATIONS

Takao ABE and Hiroshi Takeno "Dynamic behavior of intrinsic point Defects in FZ and CZ Silicon Crystals" Mat. Res. Soc. Symp. Proc., vol. 262, pp. 3–13, 1992.

* cited by examiner

Primary Examiner—Robert Kunemund
Assistant Examiner—Matthew A Anderson
(74) Attorney, Agent, or Firm—Oliff & Berridge, PLC

(57) ABSTRACT

Silicon single crystal wafers for semiconductor devices of high quality are obtained with high productivity by effectively reducing or eliminating grown-in defects in surface layers of silicon single crystal wafers produced by the CZ method. The present invention provides a method for producing a silicon single crystal wafer, which comprises growing a silicon single crystal ingot by the Czochralski method, slicing the single crystal ingot into a wafer, subjecting the wafer to a heat treatment at a temperature of 1100–1300° C. for 1 minute or more under a non-oxidative atmosphere, and successively subjecting the wafer to a heat treatment at a temperature of 700–1300° C. for 1 minute or more under an oxidative atmosphere without cooling the wafer to a temperature lower than 700° C. The present invention also provides a CZ silicon single crystal wafer, wherein density of COPs having a size of 0.09 μm or more in a surface layer having a thickness of up to 5 μm from a surface is 1.3 COPs/cm$^2$ or less, and density of COPs having a size of 0.09 μm or more in a bulk portion other than the surface layer is larger than the density of COPs of the surface layer.

24 Claims, 9 Drawing Sheets

METHOD FOR PRODUCING SILICON SINGLE CRYSTAL WAFER AND SILICON SINGLE CRYSTAL WAFER

TECHNICAL FIELD

The present invention relates to a method for producing a silicon single crystal wafer with very few crystal defects on the surface and near the surface of the wafer, and a silicon single crystal wafer.

BACKGROUND ART

As wafers for producing devices such as semiconductor integrated circuits, CZ silicon single crystal wafers grown by the Czochralski method (CZ method) have been mainly used. If crystal defects are present in such CZ silicon single crystal wafers, pattern failure and the like will be caused during the semiconductor device production. In particular, since the pattern width required for the recent highly integrated devices has become extremely fine, i.e., 0.3 μm or less, even the presence of defects of 0.1 μm size may cause pattern failure at the time of such pattern formation, and it markedly reduces production yield of devices and degrades quality characteristics of devices. Therefore, the size of crystal defects present in silicon single crystal wafers must be made small as much as possible.

Recently, in particular, it has been reported that, in silicon single crystals grown by the CZ method, crystal defects called grown-in defects introduced during the crystal growth are detected by various measurement methods. For example, in commercially produced single crystals pulled at a usual growth rate (for example, about 1 mm/min or higher), they can be detected by using a commercially available particle counter (for example, SP1 produced by KLA/Tencor Co., Ltd.) as crystal originated particles (COP).

The cause of the generation of such crystal defects is considered to be clusters of atomic holes aggregated during the production of single crystals or oxide precipitates which are aggregates of oxygen atoms introduced from quartz crucibles. If these crystal defects exist in surface layers (0–5 μm) of wafers in which devices are formed, they act as harmful defects degrading the device characteristics. Therefore, there have been investigated various methods for reducing such crystal defects.

For example, it has been known that, in order to reduce the density of the aforementioned atomic hole clusters, crystals can be grown at an extremely reduced crystal growth rate (for example, 0.45 mm/min or lower, see Japanese Patent Application Laid-open (Kokai) No. 8-330316). In this method, however, crystal defects considered to be dislocation loops formed by aggregated excessive interstitial silicon are newly generated, and markedly degrade the device characteristics. Thus, it has become clear that the method cannot be a solution of the problem. Moreover, since the method uses a crystal growth rate reduced from the conventional rate of about 1.0 mm/min to 0.4 mm/min or lower, it markedly reduces the productivity of single crystals and increases the cost.

Further, as another method, there has also been proposed a method comprising a heat treatment of wafers grown at a commercially used usual conventional crystal growth rate of about 1.0 mm/min or higher in a hydrogen atmosphere to eliminate the grown-in defects, and it is used for the actual production. However, it has been pointed out that this method sill leaves the defects in surface layers (0–5 μm from the surfaces).

Furthermore, in the aforementioned method, it is necessary to secure safety after the heat treatment in a hydrogen atmosphere by replacing the atmosphere in the heat treatment furnace with nitrogen gas and then taking out the wafers. However, a small amount of oxygen and moisture contained in the nitrogen gas may locally etch the wafer surfaces, and thus the method also suffers from a problem that surface roughness such as haze and microroughness may be degraded.

The term "haze" used herein means periodical surface roughness having a period of several to several tens of nanometers on the wafer surfaces, and it can be determined semi-quantitatively by scanning whole surfaces of wafers with a particle counter mainly utilizing a laser, and measuring intensity of scattered reflection thereof.

On the other hand, microroughness is surface roughness evaluated as a P–V (peak to valley) value or RMS (root mean square roughness) value in a fine area (e.g., 2 μm square), which are obtained by investigating the area with an atomic force microscope.

DISCLOSURE OF THE INVENTION

The present invention has been accomplished in view of the aforementioned problems, and its major object is to obtain silicon single crystal wafers for semiconductor devices of high quality from a silicon single crystal ingot produced by the CZ method with high productivity. In the silicon single crystal wafers, grown-in defects in their surface layers are effectively reduced or eliminated, and the wafers are also excellent in the wafer surface roughness.

In order to achieve the aforementioned object, the present invention provides a method for producing a silicon single crystal wafer, which comprises growing a silicon single crystal ingot by the Czochralski method, slicing the single crystal ingot into a wafer, subjecting the wafer to a heat treatment at a temperature of 1100–1300° C. for 1 minute or more under a non-oxidative atmosphere, and successively subjecting the wafer to a heat treatment at a temperature of 700–1300° C. for 1 minute or more under an oxidative atmosphere without cooling the wafer to a temperature lower than 700° C.

By the aforementioned method for producing a silicon single crystal wafer, which comprises growing a silicon single crystal ingot by the Czochralski method, slicing the single crystal ingot into a wafer, subjecting the wafer to a heat treatment at a temperature of 1100–1300° C. for 1 minute or more under a non-oxidative atmosphere, and successively subjecting the wafer to a heat treatment at a temperature of 700–1300° C. for 1 minute or more under an oxidative atmosphere without cooling the wafer to a temperature lower than 700° C., grown-in defects in the wafer surface layer, which are harmful to the semiconductor device production, can be eliminated or reduced within a short period of time. Simultaneously, a silicon single crystal wafer for semiconductor devices of high quality excellent in the wafer surface roughness can be obtained with high productivity.

In the aforementioned method, the non-oxidative atmosphere is preferably argon, nitrogen or a mixed gas of argon and nitrogen.

This is because argon, nitrogen or a mixed gas of argon and nitrogen has an advantage that it is easy to be handled and inexpensive.

In the aforementioned method, the oxidative atmosphere may be an atmosphere containing water vapor.

By using an atmosphere containing water vapor as the oxidative atmosphere as mentioned above, a high oxidation rate can be obtained, and thus interstitial silicon can efficiently be injected within an extremely short period of time to eliminate the defects. In addition, since the oxide film formed on the surface becomes relatively thick, it is suitable for applications in which the oxide film is used as it is in the wafer processing process or the device production.

In the aforementioned method, the oxidative atmosphere may also be a dry oxygen atmosphere or a mixed gas atmosphere of dry oxygen and argon or nitrogen.

By using a dry oxygen atmosphere or a mixed gas atmosphere of dry oxygen and argon or nitrogen as the oxidative atmosphere as mentioned above, a slow growth rate of the oxide film can be obtained, and thus the oxide film formed on the surface after the heat treatment can be made thin. Therefore, when the formed oxide film must be eliminated with an aqueous solution of HF or the like, the time required for this step can be shortened.

Thickness of an oxide film formed by the heat treatment under the oxidative atmosphere is preferably controlled to be 20–100 nm.

If the thickness of the oxide film formed by the heat treatment under the oxidative atmosphere is 20 nm or more, COPs in the wafer surface layer can sufficiently be eliminated. If it is 100 nm or less, even when the formed oxide film must be eliminated, time required for that step can be shortened.

Moreover, an oxide film may preliminarily be formed on the wafer surface before performing the heat treatment under a non-oxidative atmosphere.

If such an oxide film is formed, the wafer surface can be protected from formation of thermal nitride film on the wafer surface and surface roughening by etching due to the heat treatment.

In this case, furthermore, thickness of a thermal oxide film formed on the wafer surface after the heat treatment under an oxidative atmosphere is preferably controlled to be 300 nm or more.

By growing a thermal oxide film having a thickness of 300 nm or more through the heat treatment under an oxidative atmosphere, COPs on the wafer surface can be eliminated by reflow of silicon oxide during the growth of the oxide film even when the oxide film is preliminarily formed on the wafer surface before performing the heat treatment under a non-oxidative atmosphere. Therefore, COPs on the wafer surface can more surely be eliminated.

Moreover, when the silicon single crystal ingot is grown by the Czochralski method, the cooling rate of the single crystal ingot between 1150–1080° C. is preferably controlled to be at 2.3° C./min ore more.

By controlling the cooling rate of the single crystal ingot between 1150–1080° C. to be at 2.3° C./min or more when the silicon single crystal ingot is grown by the Czochralski method, a wafer having grown-in defects of a reduced size can further be subjected to the heat treatment of the present invention, and thus the grown-in defects in the wafer surface layer can more effectively be eliminated or reduced. Therefore, silicon single crystal wafers for semiconductor devices of higher quality can be obtained with high productivity.

In this case, when the silicon single crystal ingot is grown by the Czochralski method, the silicon single crystal ingot is preferably doped with nitrogen.

If a silicon single crystal ingot is doped with nitrogen when the silicon single crystal ingot is grown by the Czochralski method, a wafer having grown-in defects of a reduced size due to the nitrogen doping can further be subjected to the heat treatment of the present invention, and thus the grown-in defects in the wafer surface layer can more effectively be eliminated or reduced. Therefore, silicon single crystal wafers for semiconductor devices of higher quality can be obtained with high productivity.

In this case, when the silicon single crystal ingot doped with nitrogen is grown by the Czochralski method, the nitrogen concentration doped in the single crystal ingot is preferably controlled to be $1 \times 10^{10}$ to $5 \times 10^{15}$ atoms/cm$^3$.

This is because the concentration is desirably $1 \times 10^{10}$ atoms/cm$^3$ or higher in order to sufficiently suppress the growth of grown-in defects, and it is preferably $5 \times 10^{15}$ atoms/cm$^3$ or less in order not to inhibit single crystallization of the silicon single crystal.

Furthermore, when the silicon single crystal ingot is grown by the Czochralski method, the oxygen concentration in the single crystal ingot is preferably controlled to be 18 ppma or less according to the standard of JEIDA (Japan Electronic Industry Development Association).

Such a low oxygen concentration can further inhibit the growth of crystal defects, and also prevent the formation of oxide precipitates in the surface layer.

A silicon single crystal wafer produced by the production method of the present invention should be, for example, a CZ silicon single crystal wafer wherein density of COPs having a size of 0.09 μm or more in a surface layer having a thickness of up to 5 μm from a surface is 1.3 COPs/cm$^2$ or less, and the density of COPs having a size of 0.09 μm or more in a bulk portion other than the surface layer is larger than the density of COPs of the surface layer.

Such a silicon single crystal wafer should be a wafer with extremely few crystal defects on the wafer surface and in the wafer surface layer, and thus a silicon single crystal wafer for semiconductor devices of high quality which is excellent in electric characteristics. On the other hand, the bulk portion of the wafer should have sufficient gettering effect, because of the COP density larger than that of the surface layer. Therefore, production yield or quality characteristics of devices can be improved.

Furthermore, the silicon single crystal wafer of the present invention may have, for example, haze on the wafer surface of 0.1 ppm or less, and microroughness in a measurement area of 2 μm square of 1.0 nm or less in terms of the P–V value.

Thus, the single crystal wafer of the present invention can be one characterized not only by few crystal defects on the wafer surface and in the surface layer, but also by excellent surface roughness on the wafer surface.

As described above, according to the present invention, by successively performing the heat treatment at an elevated temperature under a non-oxidative atmosphere, and the heat treatment under an oxidative atmosphere, grown-in defects in a wafer surface layer can be eliminated or reduced at a lower temperature with a shorter period of time compared with conventional techniques, and moreover, the surface roughness of the wafer can be improved. Furthermore, the elimination or reduction of grown-in defects can be made more effectively by the control of the crystal cooling rate during the CZ crystal pulling and the doping with nitrogen impurities.

In addition, when the heat treatments are performed without using hydrogen gas, which suffers from a risk of explosion, the heat treatments can be performed comparatively safely using a usual heat treatment furnace, without considering special safety measures unlike conventional heat treatment apparatuses which use hydrogen gas.

BEST MODE FOR CARRYING OUT THE INVENTION

Figure 1:
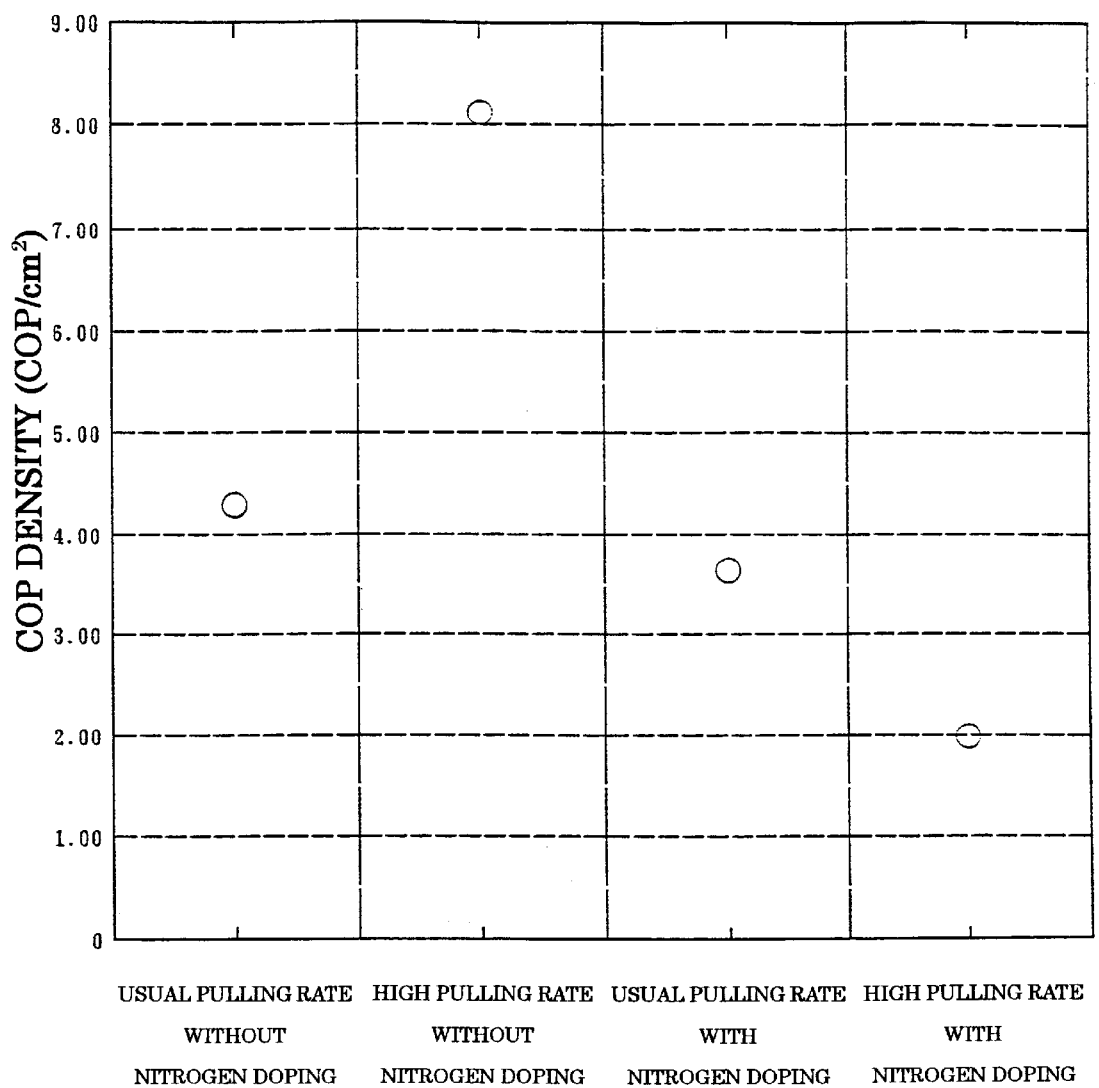
FIG. 1 shows COP densities of wafers before a heat treatment measured by a particle counter in Example 1 and Comparative Example 1.

Hereinafter, the present invention will be further explained in detail. However, the present invention is not limited by these explanations.

It was found that, by obtaining silicon wafers by the Czochralski method, and successively subjecting the wafers to a heat treatment at an elevated under a non-oxidative atmosphere, in particular, an atmosphere of argon, nitrogen or a mixed gas of them, and a heat treatment at an elevated temperature under an oxidative atmosphere, grown-in defects on the wafer surfaces and the wafer surface layers can be eliminated or reduced, and in addition, surface roughness of the wafers could be improved. Based on this finding, various conditions for obtaining the desired results were examined, and thus the present invention has been accomplished.

As described above, the means used at the industrial level for eliminating or reducing grown-in defects on wafer surfaces and wafer surface layers is a heat treatment of wafers grown at a usual crystal growth rate of about 1.0 mm/min or more at an elevated temperature under hydrogen atmosphere for eliminating grown-in defects. This method has already been commercially established, and used for the actual device production. However, it has a problem that it still leaves defects in wafer surface layers (e.g., a thickness of 0–5 $\mu$m).

The reason for the above phenomenon has been supposed as follows. In order to eliminate grown-in defects, which are aggregations of atomic holes, two processes are required. That is, the process of melting of inner wall oxide films of defects, which prevents true point defects from changing into grown-in defects, and the subsequent filling process of grown-in defects with interstitial silicon.

It is considered that, in the aforementioned heat treatment at an elevated temperature under a hydrogen atmosphere, the melting of inner wall oxide films of grown-in defects in the wafer surface layer is efficiently caused by the marked oxygen out-diffusing effect of the heat treatment. However, by the heat treatment at an elevated temperature under a hydrogen atmosphere, filling of grown-in defects with interstitial silicon cannot be efficiently caused due to injection of both of interstitial silicon, which constitutes Schottky defects, and atomic holes from the wafer surface.

Therefore, the process of filling grown-in defects with interstitial silicon takes a long period of time in the heat treatment under a hydrogen atmosphere. In particular, in order to eliminate grown-in defects having a size of 150 nm or more in terms of their diameter, a heat treatment of a long period of time at an elevated temperature, i.e., at 1200° C. for 5 hours or more is required. This markedly reduces the productivity of wafers, and in addition, the method requiring a heat treatment at an elevated temperature for long period of time under a hydrogen atmosphere cannot be considered preferable in view of safety. Furthermore, since a heat treatment is performed at an elevated temperature for a long period of time, there also arises a problem that oxygen precipitation nuclei in silicon single crystal wafers are also eliminated, and thus the gettering effect for heavy metals, which is effective in the device process, would also be lost.

These problems of the heat treatment at an elevated temperature under a hydrogen atmosphere are also imposed on the heat treatment under an argon atmosphere, except for the problem of safety, and it has been found that it also suffers from the following problems in addition to those mentioned above.

When wafers are subjected to a heat treatment at an elevated temperature under a hydrogen atmosphere or argon atmosphere, the wafers are taken out from a heat treatment furnace usually after they are cooled to a temperature of about 700–800° C. The wafers are usually taken out after the atmosphere is replaced with nitrogen atmosphere for safety. In contrast, in the case of the argon atmosphere, they can be taken out without replacing the atmosphere.

However, when the hydrogen atmosphere or the argon atmosphere is replaced with nitrogen and the wafers are taken out, small amounts of oxygen and moisture contained in the nitrogen gas react with the wafer surfaces which has been made active by the heat treatment at an elevated temperature, and hence the surfaces are locally etched so as to degrade surface roughness of the wafers (microroughness, haze etc.). Under such a situation, it is very difficult to remove the small amounts of moisture and oxygen by increasing purity of the nitrogen, and hence this means is substantially limited because it costs very much.

On the other hand, if the wafers are taken out in the argon atmosphere as it is, an uneven natural oxide film incorporating the outer air may be formed, and thereby there may arise problems, for example, the surface roughness may be degraded or the surfaces are contaminated with impurities.

The inventors of the present invention solved these problems by subjecting a wafer to a heat treatment at a temperature of 1100–1300° C. for 1 minute or more under a non-oxidative atmosphere not containing hydrogen at the lower explosion limit (about 4%) or more, in particular, an atmosphere of argon, nitrogen or a mixed gas thereof, and successively subjecting the wafer to a heat treatment at a temperature of 700–1300° C. for 1 minute or more under an oxidative atmosphere without cooling the wafer to a temperature lower than 700° C. That is, it becomes possible to allow the melting process of inner wall oxide films of the defects to efficiently proceed by the heat treatment at an elevated temperature under an atmosphere of argon, nitrogen or a mixed gas thereof. Further, it also become possible to allow the filling process of the grown-in defects with interstitial silicon to efficiently proceed and improve surface roughness of wafers by changing the heat treatment to a heat treatment under an oxidative atmosphere.

In the present invention, the melting process of the inner wall oxide films of the defects is attained by the heat treatment at an elevated temperature under an atmosphere of non-oxidative gas which does not contain hydrogen at the lower explosion limit (about 4%) or more, in particular, an atmosphere of argon, nitrogen or a mixed gas thereof, because it is very difficult to safely perform a heat treatment under an oxygen atmosphere following the heat treatment at an elevated temperature under a hydrogen atmosphere. The two heat treatment processes became possible for the first time to be performed safely by using a non-oxidative gas which does not contain hydrogen at a lower explosion limit (about 4%) or more, in particular, an atmosphere of argon, nitrogen or a mixed gas thereof, instead of the hydrogen atmosphere. Further, the melting of the inner wall oxide films of grown-in defects is efficiently caused in the heat treatment at an elevated temperature under a non-oxidative gas, in particular, an atmosphere of argon, nitrogen or a mixed gas thereof by the oxygen out-diffusing effect of the heat treatment as in a hydrogen atmosphere. Therefore, the melting process of the inner wall oxide films of grown-in defects can efficiently proceed within a short period of time like under a hydrogen atmosphere.

It is considered that the argon atmosphere has out-diffusing effect for oxygen comparable to that of the hydrogen atmosphere, because the natural oxide films on the wafers are sublimated as SiO gas and hence eliminated by the heat treatment at an elevated temperature of 1100–1300° C. under an argon atmosphere. Moreover, when nitrogen atmosphere is used, the natural oxide films on the surfaces are preferably removed with an aqueous solution of HF, since the film are unlikely to be uniformly removed in a nitrogen atmosphere, although it has comparable out-diffusing effect. In addition, out-diffusing effect comparable to that obtained under a hydrogen atmosphere can also be obtained under a mixed atmosphere of argon and nitrogen.

In order to sufficiently melt the inner wall oxide films of grown-in defects, this heat treatment was designed to be performed at the temperature of 1100–1300° C. for 1 minute or more.

Moreover, the heat treatment at an elevated temperature under a nitrogen atmosphere may form an extremely stable thermal nitride film on silicon wafer surfaces, and hence it may become extremely troublesome to remove the film in the following process steps, or the wafer surfaces may suffer from surface roughening due to a small amount of oxygen or moisture in nitrogen. As for these problems, the inventors of the present invention found that the wafer surfaces could be protected from the unnecessary film formation and the surface roughening under a nitrogen atmosphere by preliminarily forming a protective oxide film on the wafer surfaces before the heat treatment.

Furthermore, such a protective oxide film can, in addition to protecting the wafer surfaces from the unnecessary film formation or the surface roughening, prevent contamination with heavy metal impurities diffusing into the inside of wafers from the inside of furnace during the heat treatment.

The heat treatments for the melting process of inner wall oxide films of defects and the filling process of the grown-in defects with interstitial silicon are performed successively, because, unless the heat treatments for these two processes are performed successively, the inner wall oxide films of grown-in defects grow again due to decrease of wafer temperature, and consequently it becomes impossible to eliminate or reduce the defects. Therefore, the method was designed to successively perform the two processes without cooling the wafers to a temperature of 700° C. or lower, at which temperature the inner wall oxide films of grown-in defects grow again.

According to the present invention, the process of filling grown-in defects is attained by a heat treatment under an oxidative atmosphere. This is because only interstitial silicon atoms are injected from wafer surfaces without injection of atomic holes during the heat treatment under an oxidative atmosphere, unlike the case where the heat treatment under a hydrogen atmosphere is continued, and hence the grown-in defects are efficiently filled with interstitial silicon. By this, the grown-in defects can be efficiently filled with interstitial silicon atoms and thus eliminated, and the surface roughening or contamination can be prevented because the surfaces activated by the heat treatment at an elevated temperature under a non-oxidative atmosphere are oxidized.

In order to sufficiently fill the grown-in defects and eliminate them, this heat treatment is preferably performed at a temperature of 1000–1300° C. for 1 minute or more. However, if it is 700° C. or higher, the effect for reducing grown-in defects and preventing surface roughening can be obtained.

As the oxidative atmosphere, an atmosphere containing water vapor, atmosphere consisting of 100% dry oxygen (dry $O_2$), atmosphere of a mixed gas of dry oxygen and argon or nitrogen and so forth can be used.

When an atmosphere containing water vapor is used, high oxidation rate can be obtained, and hence interstitial silicon can efficiently be injected within a very short period of time to eliminate defects even at a relatively low temperature of about 700° C. In this case, the oxide film formed on the surface becomes relatively thick, and it is suitable for applications which utilize this oxide film as it is in wafer processing processes such as production of SOI wafers, or device production processes.

On the other hand, when a dry oxygen atmosphere or an atmosphere of a mixed gas of dry oxygen and argon or nitrogen is used, the growth rate of the oxide film becomes slow. Therefore, the oxide film formed after the heat treatment can be made thin. Therefore, when the formed oxide film must be removed with an aqueous solution of HF or the like, the time required for that process can be shortened, and hence the process becomes efficient.

Further, as for the case where a mixed gas atmosphere is used, there is an anxiety that the effect for eliminating defects by injecting interstitial silicon may become poor when the growth rate of the oxide film is slow, and hence the thickness of the formed oxide film is thin. Therefore, the inventors of the present invention examined by the following experiment how large thickness of the oxide film must be formed in how much concentration of oxygen in order to sufficiently eliminate the defects.

Figure 4A:
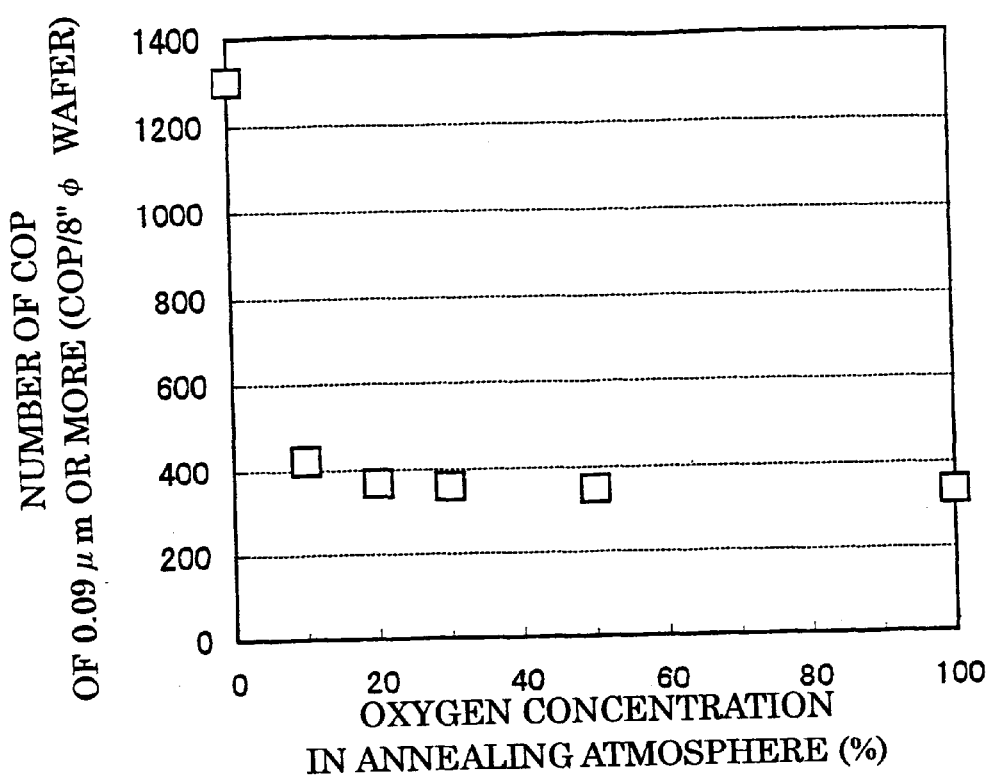
FIG. 4A shows relationship between oxygen concentration in annealing atmosphere and COP number.
Figure 4B:
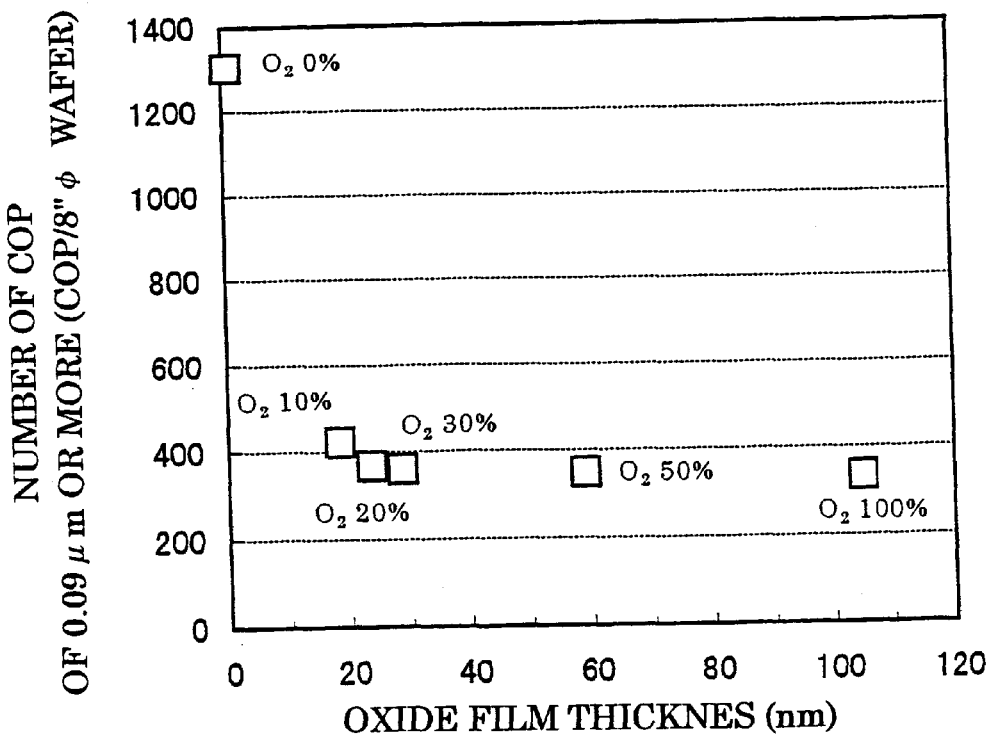
FIG. 4B shows relationship between thickness of oxide film formed by annealing and COP density.

Wafers are annealed at 1200° C. for 40 minutes under a 100% argon atmosphere, and annealed for 20 minutes in each of 6 kinds of mixed gases of argon and dry oxygen with different oxygen concentrations (oxygen concentrations of 0, 10, 20, 30, 50 or 100%). Then, the surfaces of the wafers were polished by 5 µm, and COPs having a size of 0.09 µm or larger on the surfaces were measured. The results are shown FIGS. 4A and 4B. The polishing was performed by a thickness of 5 µm in order to examine the COP eliminating effect in the wafer surface layers. FIG. 4A shows relationship between the oxygen concentration in annealing atmosphere and the COP number, and FIG. 4B shows relationship between thickness of the oxide film formed by annealing and the COP density.

From the results shown in FIG. 4, it can be seen that the effect equivalent to that obtained with 100% dry oxygen (about 100 nm of the oxide film thickness) can be obtained if the thickness of the formed oxide film has a thickness of 20 nm or more even when the oxygen concentration in the atmosphere is about 10%.

Figure 5:
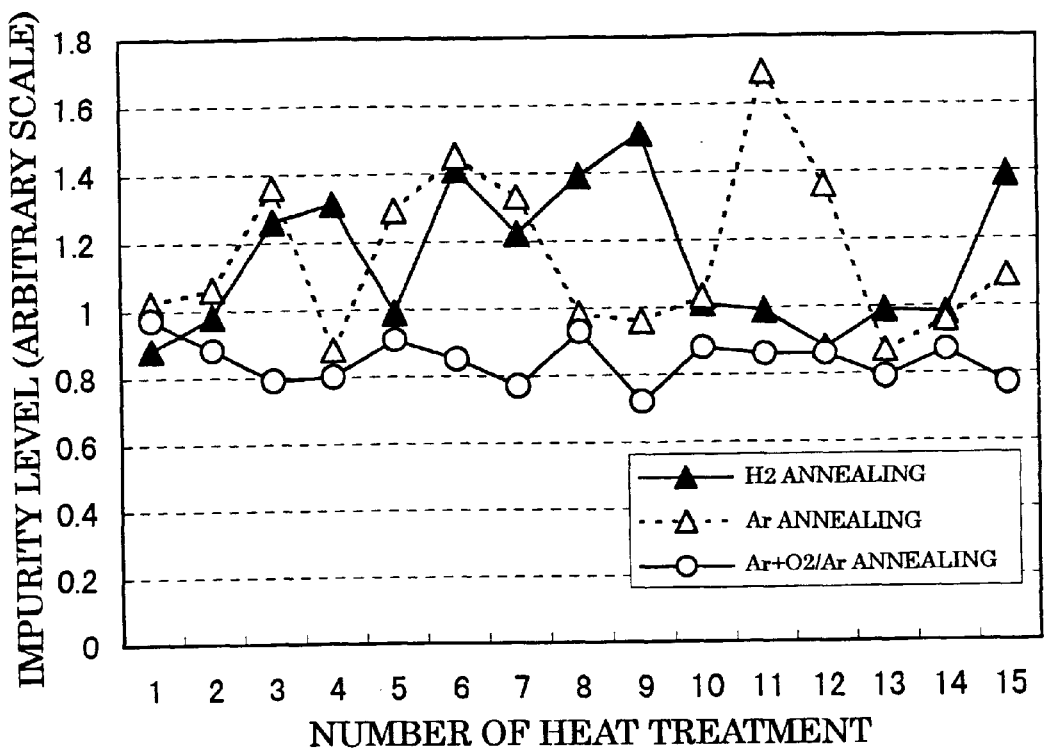
FIG. 5 shows variation of metal impurity contamination level of wafers subjected to each of heat treatment of the present invention and conventional heat treatments repeated in separate tubes.

Furthermore, it was found that the contamination of wafers from tubes or boats can be minimized by subjecting the wafers to a heat treatment under an oxidative atmosphere after the heat treatment under a non-oxidative atmosphere. FIG. 5 shows variation of metal impurity contamination level of wafers subjected to each of a heat treatment consisting of annealing at 1200° C. for 40 minutes under a 100% argon atmosphere and subsequent annealing for 20 minutes under an atmosphere of a mixed gas of argon and dry oxygen (30% of oxygen concentration) and a heat treatment consisting of annealing at 1200° C. for 60 minutes under a 100% hydrogen or 100% argon atmosphere, which were repeated in separate tubes, where the metal impurity contamination levels after each heat treatment were indicated. The contamination level was determined based on SPV (Surface Photo Voltage) by using a Wafer Contamination Monitor System (trade name) produced by Semiconductor Diagnostics Inc. (SDI).

It can be seen that, with the annealing in an atmosphere consisting only of hydrogen or argon, the impurity level is suddenly degraded because etching of tubes or boats is caused. On the other hand, it is considered that, with the heat treatment comprising the annealing in an oxidative atmosphere, a protective oxide film is always formed because an oxide film is also formed on the wafer surfaces and surfaces of tubes and boats in the annealing step, and hence the effect for minimizing the contamination from the tubes or boats is exerted.

Crystal defects that can be eliminated by such an oxidation heat treatment at 700–1300° C. are limited to those present in the inside of wafers that do not appear on the silicon wafer surfaces. This is because the elimination of the defects in this heat treatment is caused by filling of void type crystal defects through injection of interstitial silicon from the surfaces caused by the oxidation. Therefore, void type crystal defects such as COP exposed to the surfaces must be eliminated by migration of silicon atoms at the wafer surfaces through a heat treatment in an argon atmosphere or the like, which is performed before this oxidation heat treatment. However, if the surface protective oxide film is formed beforehand as mentioned above, the elimination of surface COPs may become insufficient, because the migration of surface silicon atoms is inhibited by the oxide film.

Therefore, the inventors of the present invention contrived a method for sufficiently eliminate COPs on the wafer surfaces by providing a thermal oxide film having a thickness of 300 nm or more on the wafer surfaces after the oxidation heat treatment at 700–1300° C. This is because, if a thermal oxide film after the oxidation heat treatment a thickness of 300 nm or more, the profile of COPs on the surfaces becomes smooth during the growing process of the thermal oxide film, and thus an effect substantially the same as elimination of COPs can be obtained. Moreover, the aforementioned method is effective also because the mean size of COPs on the wafer surfaces is 100–200 nm, and if an oxide film having a thickness of about 300 nm is formed, it will be enough to incorporate COPs therein to eliminate them.

The oxide film formed by this oxidation heat treatment can be removed with an aqueous solution of HF or the like.

The aforementioned heat treatment of the present invention exhibits markedly higher efficiency for eliminating or reducing grown-in defects compared with the conventional heat treatment under a hydrogen atmosphere, and thus it can eliminate or reduce defects by a heat treatment of a short period of time. Therefore, it also exhibits a secondary effect that it can maintain the gettering ability by not eliminating, but preserving the oxygen precipitation nuclei, which serve as gettering sites for heavy metals and thus effective for the device step.

Furthermore, the inventors of the present invention found that the effect for eliminating or reducing grown-in defects in silicon single crystal wafers could be further improved by producing a silicon wafer having few grown-in defects of a large size with high productivity from a silicon single crystal ingot obtained through a method for growing a silicon single crystal ingot by the Czochralski method wherein the cooling rate of the single crystal ingot between the temperature range of 1150–1080° C. is controlled to be 2.3° C./min or higher, and a method for growing a silicon single crystal ingot with nitrogen doping, and subjecting the obtained wafer to the non-oxidative heat treatment in argon or the like and the oxidative heat treatment according to the present invention.

That is, it is said that aggregation of the grown-in defects is caused within the temperature range of 1150–1080° C. during the crystal growth. Therefore, by using a fast cooling rate of 2.3° C./min or more within the temperature range of 1150–1080° C. to shorten the staying time in that temperature range, it becomes possible to control the size and the number of grown-in defects.

Moreover, it has been noted that, if nitrogen is doped in a silicon single crystal, the aggregation of atomic holes in the silicon is inhibited (T. Abe and H. Takeno, Mat. Res. Soc. Symp. Proc., Vol. 262, 3, 1992). It is thought that this effect is obtained because the aggregation process of atomic holes is shifted from that consisting of homogenous nucleus formation to that consisting of heterogenous nucleus formation. Therefore, if nitrogen is doped in a silicon single crystal when it is grown by the CZ method, a silicon single crystal having few grown-in defects can be obtained, and a silicon single crystal wafer having few grown-in defects can be obtained by processing the silicon single crystal. In addition, according to this method, the crystal growth rate need not necessarily be lowered like the aforementioned conventional method, and therefore silicon single crystal wafers can be obtained with high productivity.

Moreover, when a silicon single crystal ingot is grown by the Czochralski method, the oxygen concentration in the single crystal ingot is preferably controlled to be 18 ppma or less. This is because, with such a low oxygen concentration, the growth of crystal defects can further be inhibited, and the formation of oxide precipitates in a wafer surface layer can be prevented. When the single crystal is doped with nitrogen, in particular, the oxygen precipitation is promoted. Therefore, in such a case, it is preferable to prevent the formation of oxide precipitates in a wafer surface layer by using such an oxygen concentration as mentioned above.

Specifically, in order to control the size and the number of grown-in defects by controlling the cooling rate in the Czochralski method used in the present invention, the pulling rate of the crystal can be changed. For example, if a certain specific pulling apparatus is used and a pulling rate of single crystal is set to be 1.8 mm/min, the cooling rate becomes faster compared with the case where the crystal is pulled at 1.0 mm/min by the same apparatus. As other methods, the cooling rate within the temperature range of 1150–1080° C. can also be controlled by altering arrangements, structures and so forth of members within a region of furnace called a hot zone.

Moreover, the size of grown-in defects can also be controlled during the single crystal growth by the Czochralski method by doping a single crystal with nitrogen impurities. In this case, a silicon single crystal ingot doped with nitrogen can be obtained according to a known method such as one disclosed in Japanese Patent Application Laid-open (Kokai) No. 60-251190.

That is, the Czochralski method comprises contacting a seed crystal with a melt of polycrystal silicon raw material contained in a quartz crucible, and slowly pulling it with rotation to grow a silicon single crystal ingot having an intended diameter. In such a method, nitrogen can be doped in the pulled silicon single crystal, for example, by preliminarily introducing nitride into the quartz crucible, adding nitride into the silicon melt, or using an atmosphere gas containing nitrogen. The doping amount of nitrogen in the crystal can be adjusted by controlling the amount of nitride, concentration or time of introduction of nitrogen gas.

By doping a single crystal with nitrogen when it is grown by the Czochralski method, grown-in defects to be introduced during the crystal growth can be reduced.

As for the reason for the size reduction of crystal defects introduced into silicon when a silicon single crystal is doped with nitrogen, it is considered to be due to the shift of aggregation process of atomic holes from that consisting of homogenous nucleus formation to that consisting of heterogenous nucleus formation as described above.

Therefore, the concentration of nitrogen to be doped is preferably $1 \times 10^{10}$ atoms/cm$^3$ or higher, more preferably $5 \times 10^{13}$ atoms/cm$^3$ or higher, in which ranges the heterogenous nucleus formation is sufficiently caused. The aggregation of crystal defects can sufficiently be inhibited by a concentration of the doped nitrogen in those ranges.

On the other hand, if the nitrogen concentration exceeds $5 \times 10^{15}$ atoms/cm$^3$, which is the solid solubility limit in a silicon single crystal, the single crystallization of the silicon single crystal itself is inhibited. Therefore, it is preferred that it does not exceed that concentration.

In the present invention, when a silicon single crystal ingot is grown by the Czochralski method, the oxygen concentration in the single crystal ingot is preferably controlled to be 18 ppma or less. Such a low oxygen concentration in the silicon single crystal as mentioned above can further inhibit the growth of crystal defects, and prevent formation of oxide precipitates in the surface layer.

When a a silicon single crystal ingot is grown, the oxygen concentration in the silicon single crystal ingot may be reduced to the aforementioned ranges by a conventional method. An oxygen concentration within the aforementioned ranges can easily be obtained by, for example, reducing crucible rotation number, increasing introduced gas flow rate, lowering atmospheric pressure, controlling temperature distribution and convection of a silicon melt or the like.

In this way, a silicon single crystal ingot in which size and number of grown-in defects are reduced can be obtained by the Czochralski method. This ingot is sliced by using a cutting machine such as an inner diameter slicer or wire saw, and subjected to steps of chamfering, lapping, etching, polishing and so forth to be processed into silicon single crystal wafers. Of course, these steps are mere examples, and there may be used various other steps such as cleaning step. Further, the steps are used with suitable modification including the alteration of the order of steps, omission of some steps and so forth.

Then, the wafer obtained as described above is subjected to a heat treatment at an elevated temperature under a non-oxidative gas atmosphere such as argon, nitrogen or a mixed gas thereof and a heat treatment at an elevated temperature under an oxidative atmosphere for eliminating or reduce grown-in defects. For performing these heat treatments, any widely marketed heat treatment furnaces of any type can be used so long as they are heat treatment furnaces of controlled cleanliness.

For example, a horizontal or vertical type diffusion furnace in which heating is attained by a heater or a single wafer processing type wafer heating apparatus in which heating is attained by a lamp can be used. What is important for efficiently eliminating or reducing grown-in defects is to secure sufficient heat treatment temperature and heat treatment time for the heat treatment under a non-oxidative atmosphere and sufficient heat treatment temperature and heat treatment time for the subsequent heat treatment under an oxidative atmosphere, and to successively perform the two heat treatments so that the temperature should not be unduly decreased between the two heat treatments.

For that purpose, it is necessary to subject a wafer to a heat treatment at a temperature of 1100–1300° C. for 1 minute or more in a non-oxidative gas, in particular, argon, nitrogen or a mixed gas of argon and nitrogen, and then successively subjected to a heat treatment at a temperature of 700–1300° C. for 1 minute or more under an oxidative atmosphere without cooling the wafer to a temperature lower than 700° C.

As mentioned above, if the heat treatment under an atmosphere of a non-oxidative gas, in particular, argon, nitrogen or a mixed gas of argon and nitrogen, and the heat treatment under an oxidative atmosphere are not performed successively, the inner wall oxide films of grown-in defects grow again, and consequently it becomes impossible to eliminate or reduce the defects. Therefore, it is preferable to perform the heat treatment in an argon atmosphere or the like and then successively perform the oxidation heat treatment before the wafers are cooled to a temperature lower than 700° C. without taking out the wafers from the furnace. Further, by successively performing the heat treatments at the same temperature, the heat treatment time can be shortened.

For the above purpose, for example, after the heat treatment under an atmosphere of argon, nitrogen, a mixed gas of argon or the like is performed, the atmospheric gas can be exhausted without lowering the temperature in the furnace, and oxygen gas can be introduced at a desired concentration into the furnace to perform the oxidation heat treatment. According to the present invention, the first stage heat treatment for melting inner wall oxide films of defects is performed under an atmosphere of non-oxidative gas such as argon, nitrogen or a mixed gas of argon and nitrogen, which does not contain hydrogen at the lower explosion limit (about 4%) or more. Therefore, the oxidation heat treatment of the subsequent stage can safely be performed in a conventional commercially available heat treatment furnace.

Further, when the heat treatment for melting inner wall oxide films of defects is performed under an atmosphere of non-oxidative gas such as argon, nitrogen or a mixed gas of argon and nitrogen is performed for wafers having a protective oxide film formed beforehand on the wafer surfaces, the heat treatment for forming the oxide film may precede the heat treatment for melting inner wall oxide films and performed successively, or the oxide film may be formed by an utterly separate heat treatment beforehand. The formation of the oxide film may be attained by a thermal oxidation such as dry oxidation with so-called dry oxygen and wet oxidation using an atmosphere containing water vapor, or the oxide film may be a CVD oxide film formed by the CVD (chemical vapor deposition) method.

As the heat treatment under an oxidative atmosphere at the second stage, either of the dry oxidation using an atmosphere not containing water vapor and the wet oxidation using an atmosphere containing water vapor may be used, and equivalent effects can be expected for the effect of injecting interstitial silicon into grown-in defects and the effect of improving the surface roughness, which constitute the essential characteristics of the present invention.

Hereafter, the present invention will be specifically explained with reference to the following examples and comparative examples. However, the present invention is not limited to these.

EXAMPLE 1
and
Comparative Example 1

75 kg of raw material polycrystal silicon was charged into a quartz crucible having a diameter of 24 inches, and two single crystal ingots of P-type having a diameter of 8 inches, direction <100> and an oxygen concentration of 14 ppma (JEIDA) were each pulled at a usual pulling rate of 1.0 mm/min and a high pulling rate of 1.8 mm/min according to the CZ method. At the high pulling rate, the cooling rate within the range of 1150–1080° C. was 2.5° C./min. With the aforementioned two kinds of pulling rates, additional two silicon single crystal ingots were pulled from the raw material doped with nitrogen so that the nitrogen concentration in the silicon single crystal ingots should be $5 \times 10^{14}$ atoms/cm$^3$.

Two wafers were cut out from each of the four single crystal ingots obtained above by using a wire saw, and subjected to chamfering, lapping, etching and mirror polishing to produce eight silicon single crystal mirror surface wafers of four kinds, which has a diameter of 8 inches, under the substantially same conditions except for the pulling rate and use of nitrogen doping.

In order to measure grown-in defect density of the obtained eight silicon single crystal wafers, the wafers were cleaned with a mixture of aqueous ammonia ($NH_4OH$), aqueous hydrogen peroxide ($H_2O_2$) and ultrapure water (1:1:10) at a temperature of about 80° C. for 1 hour. Then, density of COPs having a size of 0.13 μm or more was measured for the wafer surfaces by SP1 particle counter produced by KLA/Tencor Co., Ltd. The results of the measurement are shown in FIG. 1.

From the results shown in FIG. 1, it can be seen that the COP density becomes smaller in the order of the wafer obtained with the high pulling rate, the wafer obtained with the usual pulling rate, the wafer doped with nitrogen and obtained with the usual pulling rate, and the wafer doped with nitrogen and obtained with the high pulling rate. These measurement results indicate averages of values obtained from two wafers of the same kind.

Figure 2:
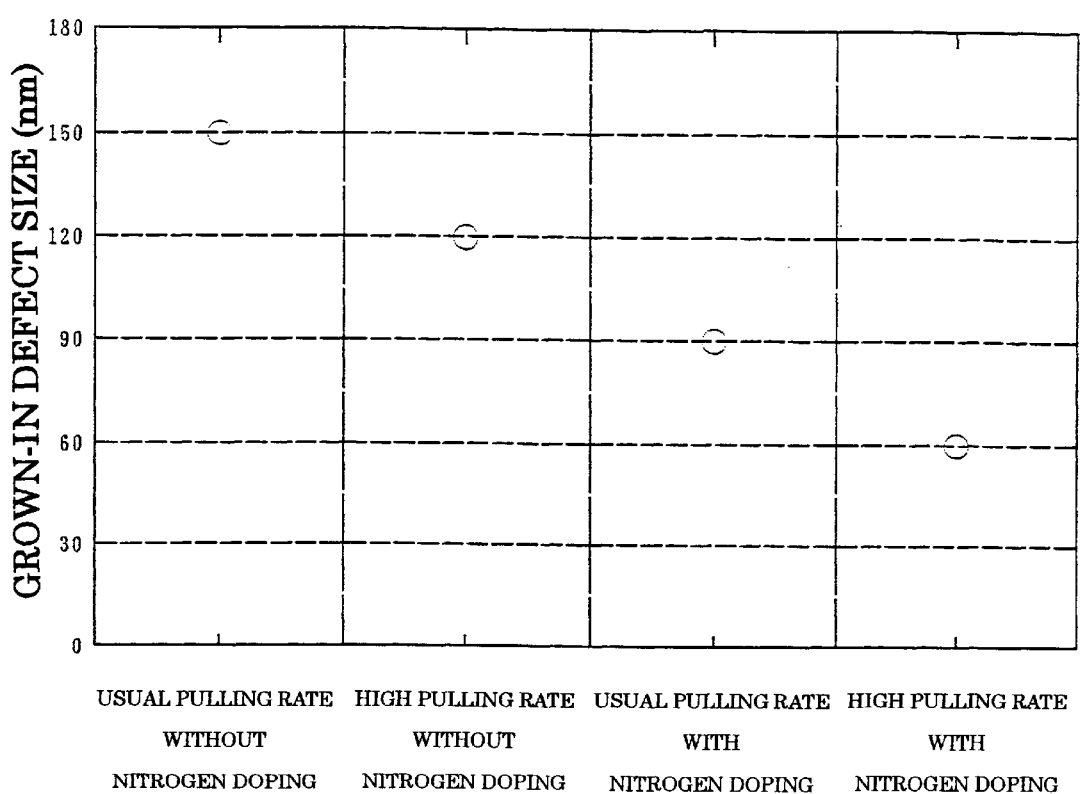
FIG. 2 shows sizes of grown-in defects of wafers before a heat treatment measured by the OPP method in Example 1 and Comparative Example 1.

Size of grown-in defects was measured by the OPP (optical precipitate profiler) method. In this OPP method, which utilizes a Nomarski differential interference microscope, a laser light emitted from a light source is first separated into two linearly polarized light beams by a polarizing prism, which are orthogonally intersects with each other and have phases different by 90°, and the beams are entered into a wafer from the wafer mirror surface side. At that time, when one beam passes a defect, phase shift is caused and hence phase difference between the two beams is produced. This phase difference is detected by a polarization analyzer after the beams transmit the wafer back face to detect the size of the grown-in defect. The results of this measurement are shown in FIG. 2. FIG. 2 shows the measured maximum defect sizes.

From the results shown in FIG. 2, it can be seen that the grown-in defect size measured by the OPP method becomes smaller in the order of the wafer obtained with the usual pulling rate, the wafer obtained with the high pulling rate, the wafer doped with nitrogen and obtained with the usual pulling rate, and the wafer doped with nitrogen and obtained with the high pulling rate. These measurement results indicate the measured maximum defect size in terms of the diameter as averages of values obtained from two wafers of the same kind.

Then, one wafer among the two wafers of each kind was subjected to a heat treatment at 1200° C. for 1 hour under an argon atmosphere in a diffusion furnace, and successively subjected to wet oxidation at a temperature of 1200° C. for 10 minutes under an oxygen atmosphere without taking out the wafer from the furnace so as not to cool the wafer to a temperature of 800° C. or lower. After the heat treatments, the wafer surface was polished by about 3 μm in order to measure COPs in the surface layer. Then, the COP density for those having a size of 0.13 μm or more was measured by the aforementioned method using a particle counter.

For comparison, the other remained wafer among the two wafer of each kind was subjected to a heat treatment at the temperature of 1200° C. for 1 hour and 10 minutes under a hydrogen atmosphere in a similar diffusion furnace. The surface of the obtained wafer was similarly polished by about 3 μm, and the COP density for those having a size of 0.13 μm or more was measured.

Figure 3:
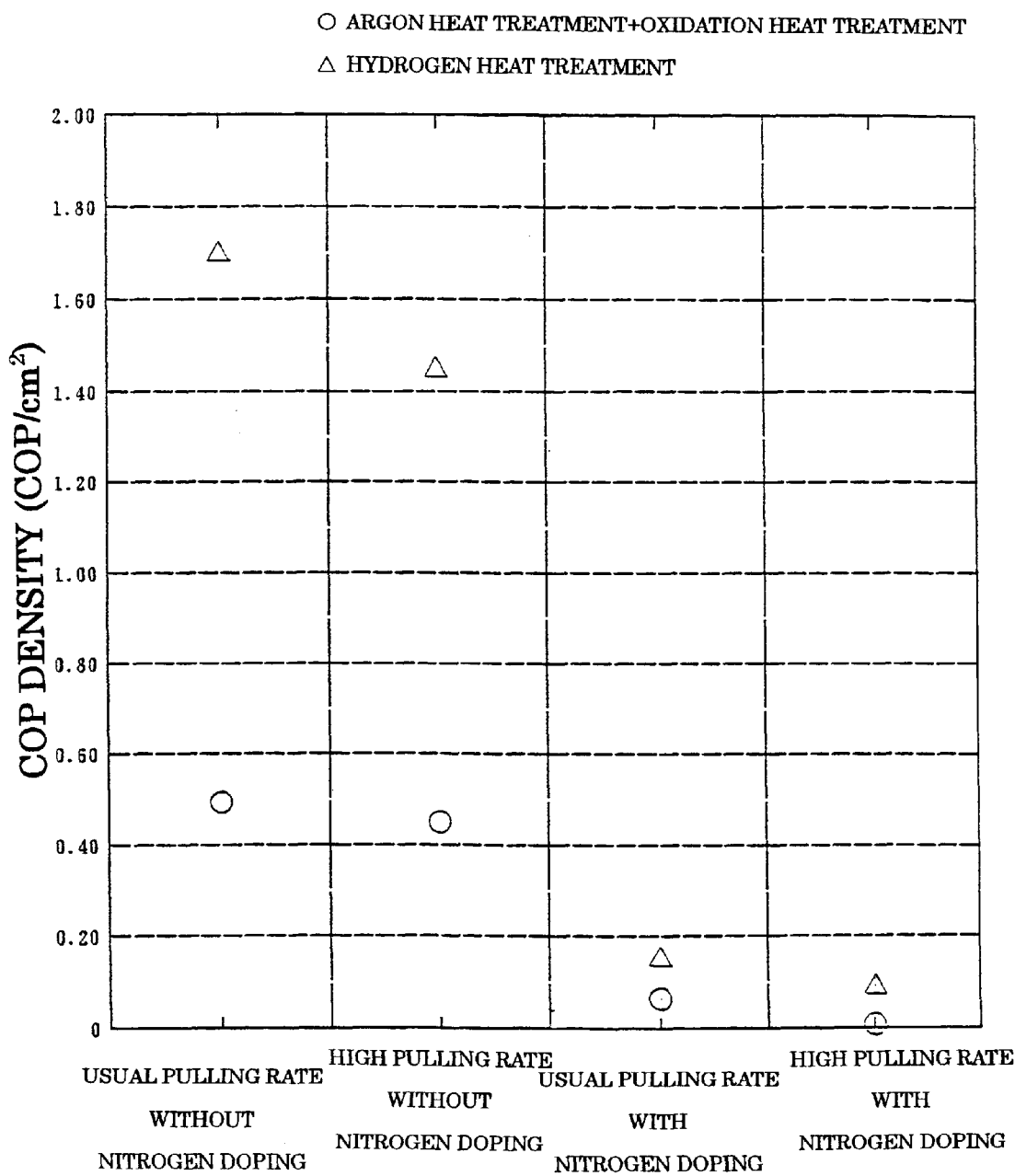
FIG. 3 shows COP densities of wafers after a heat treatment measured by a particle counter in Example 1 and Comparative Example 1.

The results of the COP density measurement of these eight wafers are shown in FIG. 3. The plots indicated with circles represent the COP densities of the wafers which were successively subjected to the heat treatment under an argon atmosphere and the heat treatment under an oxidative atmosphere according to the present invention, and the plots indicated with triangles represents COP densities of the wafers which were subjected only to the conventional heat treatment under a hydrogen atmosphere.

From the results shown in FIG. 3, it can be seen that the COP density of the wafers successively subjected to the heat treatment under an argon atmosphere and the heat treatment under an oxidative atmosphere were markedly reduced. In particular, it can be seen that, in the wafer obtained with the high pulling rate and doped with nitrogen, defects having a size of 0.13 μm or more, which may cause a problem in the device production, could be substantially completely eliminated, because the COP density and the COP size were reduced before the heat treatment.

On the other hand, it can also seen that, when the wafers were subjected to the conventional heat treatment under a hydrogen atmosphere for the same period of time, the effect for reducing the COP density was bad in all of the wafers.

EXAMPLE 2
and

Comparative Example 2

Eight silicon single crystal mirror surface wafers were produced from the single crystal ingot not doped with nitrogen and pulled with a usual pulling rate in Example 1 and Comparative Example 1. These were divided into two sets of four wafers. An oxide film having a thickness of 5, 10 or 20 nm was formed as a protective oxide film on each of three wafers from each set, and no oxide film was formed on the remained one wafer from each set. The wafers of one set were subjected to a heat treatment under a nitrogen atmosphere, and the wafers of the other set under an atmosphere of 50% nitrogen and 50% argon at 1200° C. for 1 hour in a diffusion furnace. Then, the wafers of the both sets were successively subjected to wet oxidation at 1200° C. for 30 minutes without taking out the wafers from the furnace so as not to cool the wafers to a temperature of 800° C. or lower.

When the wafers subjected to the above heat treatment were taken out from the furnace, the thickness of the oxide films was about 600 nm for all of the wafer surfaces on which protective oxide films were formed beforehand, but these oxide films could be removed with an aqueous solution of HF. On the other hand, a thermal nitride film was formed on the wafer surface on which no protective oxide film had been formed, and it was difficult to be removed. Therefore, it was removed by performing dry etching.

Then, the surface of each wafer was polished by about 3 μm, and COP density for those having a size of 0.13 μm or more was measured by the method using a particle counter in the same manner as in Example 1. As a result, the COP density was 1.0 COP/cm$^2$ or less for all of the wafers.

From these results, it can be seen that the COP density of the silicon wafers on which a protective oxide film was formed and a thermal oxide film with a thickness of 600 nm, which exceeded 300 nm, was provided after the oxidation heat treatment at 1200° C. was improved to a level similar to that of the wafer subjected to the heat treatment without forming a protective oxide film.

That is, it can be seen that, by forming a protective oxide film beforehand, the film formation on the wafer surface and so forth can be prevented even when the heat treatment under a non-oxidative atmosphere is performed under a nitrogen atmosphere, and, even in such a case, the COPs on the surface can be improved to a level similar to that of the wafer with no protective oxide film by providing a thickness of 300 nm or more for the thermal oxide film on the wafer surface after the heat treatment under an oxidative atmosphere.

EXAMPLE 3
and

Comparative Example 3

CZ wafers obtained from a single crystal ingot pulled under the same conditions as in Example 1 (at the usual pulling rate, without nitrogen doping) except that it was pulled so that the interstitial oxygen concentration should be 16 ppma (JEIDA) were subjected to annealing at 1200° C. for 40 minutes in a 100% Ar atmosphere and then annealing at 1200° C. for 20 minutes in a mixed gas of 30% dry $O_2$ and 70% Ar, or subjected to annealing at 1200° C. for 1 hour in a 100% $H_2$ atmosphere. Then, COP density and time zero dielectric breakdown characteristic of the wafers were compared. In this experiment, VERTEX3 produced by Kokusai Electric Co., Ltd. was used as the annealing furnace, and the temperature at which the wafers were introduced and taken out was 800° C.

Figure 6:
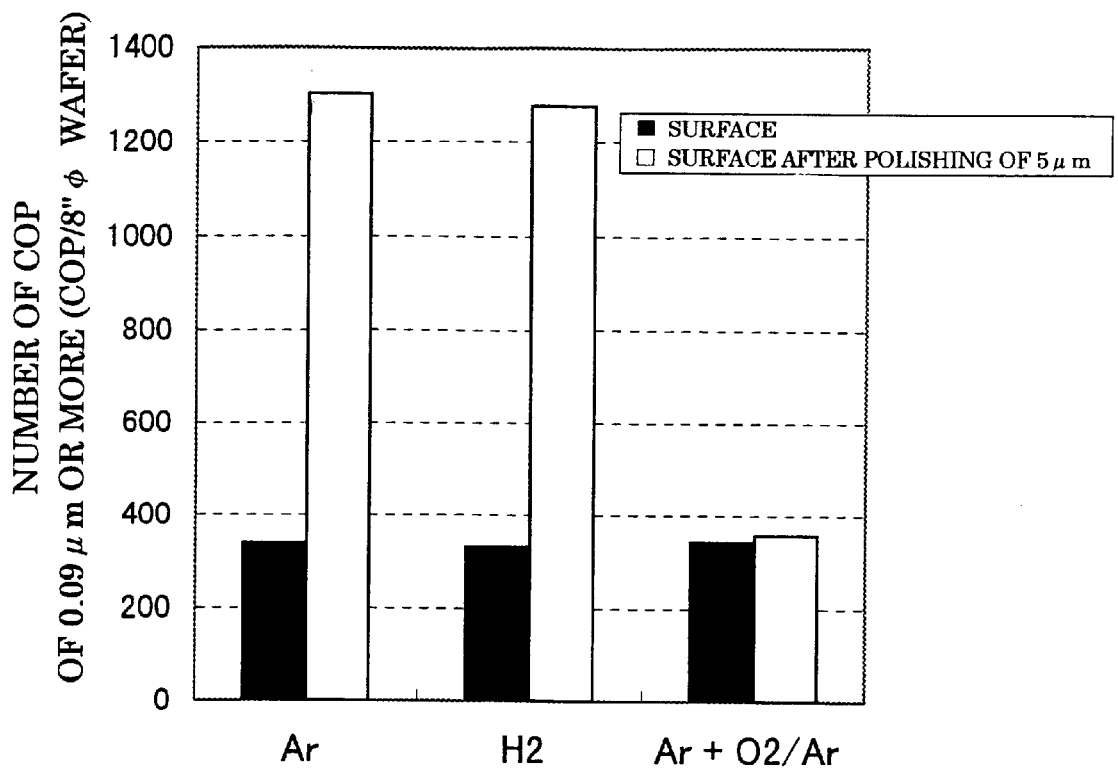
FIG. 6 shows COP densities on wafer surfaces after a heat treatment, and COP densities of the surfaces after polishing of 5 $\mu$m measured in Example 3 and Comparative Example 3.

FIG. 6 represents COP densities on the wafer surfaces after heat treatment under each condition, and COP densities of the surfaces after the polishing of 5 μm. The COPs was measured by SP1 particle counter produced by KLA/Tencor Co., Ltd., and LPDs (light point defects) having a size of 0.09 μm or more were counted as COPs.

From the results shown in FIG. 6, it can be seen that, only in the wafer subjected to the heat treatment of the present invention, the effect of eliminating crystal defects to a depth of at least 5 μm from the surface was observed, and the COP density could be 1.3 COPs/cm$^2$ or less (400 COPs/8 inch wafer or less).

That is, even for a wafer containing COPs having a large size of about 0.15 μm, the COPs can be eliminated or made small to a size of less than 0.09 μm, in which size COPs seldom affect device characteristics, over a depth of the surface layer of 5 μm or more from the surface by subjecting the wafer to the heat treatment of the present invention.

Figure 7:
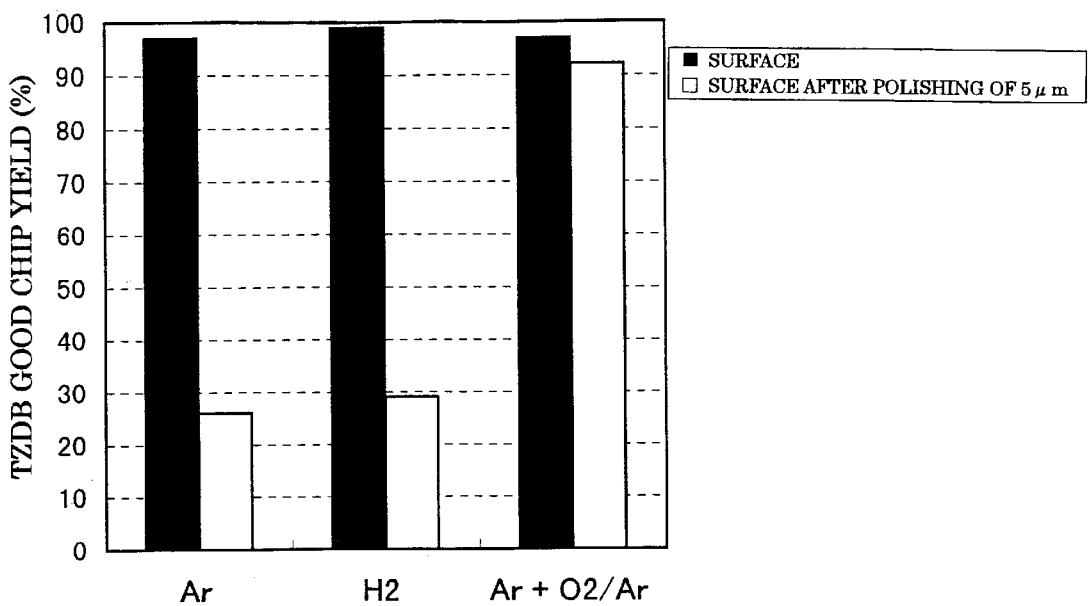
FIG. 7 shows TZDB good chip yields for wafer surfaces after a heat treatment, and TZDB good chip yields for the surfaces after polishing of 5 $\mu$m measured in Example 3 and Comparative Example 3.
Figure 8:
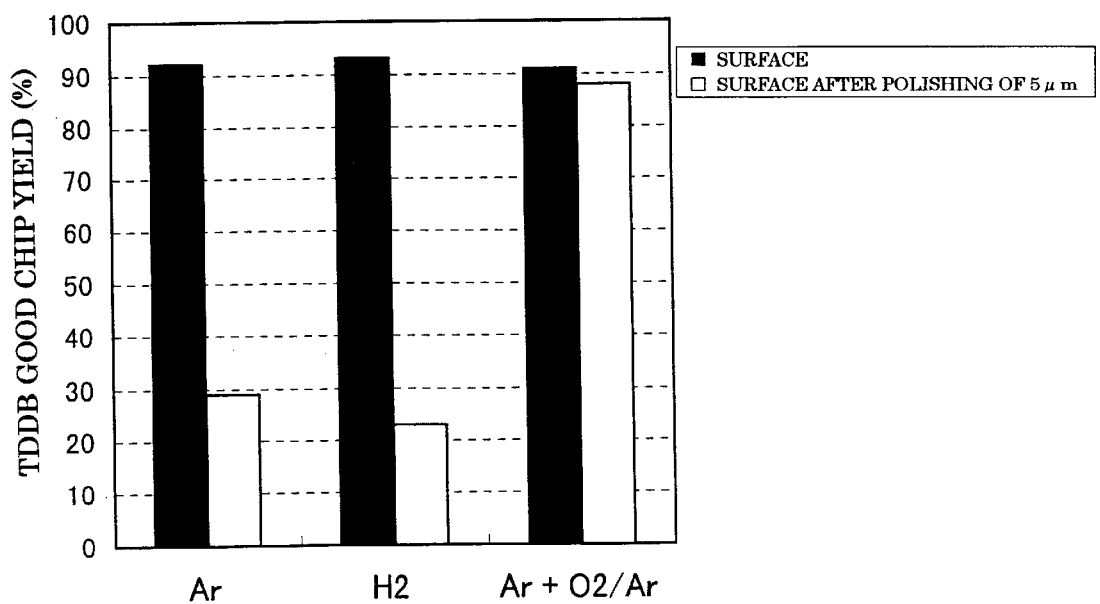
FIG. 8 shows TDDB good chip yields for wafer surfaces after a heat treatment, and TDDB good chip yields for the surfaces after polishing of 5 $\mu$m measured in Example 3 and Comparative Example 3.

FIGS. 7 and 8 represent the results of measurement of TZDB (time zero dielectric breakdown) and TDDB (time dependent dielectric breakdown) of the surfaces after each heat treatment and the surfaces after polishing of 5 μm.

The TZDB good chip yield in FIG. 7 means a good chip yield when one exhibiting a time zero dielectric breakdown of 8 MV/cm or more under the conditions of 25 nm of gate oxide film thickness, 8 mm$^2$ of gate area and 1 mA/cm$^2$ of electric current density in decision at room temperature is considered as a good chip. The TDDB good chip yield in FIG. 8 means a good chip yield when one exhibiting a time zero dielectric breakdown of 25 C/cm$^2$ or more under the conditions of 25 nm of gate oxide film thickness, 4 mm of gate area and 1 mA/cm$^2$ of stress electric current at room temperature is considered as a good chip.

From the results shown in FIGS. 7 and 8, it can be seen that a good chip yield of 80% more was surely obtained to a depth of at least of 5 μm from the surface for both of TZDB and TDDB.

EXAMPLE 4
and

Comparative Example 4

CZ wafers obtained from a single crystal ingot pulled under the same conditions as in Example 3 and Comparative Example 3 were subjected to annealing for 40 minutes under a 100% Ar atmosphere and then annealing for 20 minutes under an atmosphere of a mixed gas of 30% dry $O_2$ and 70%

Figure 9:
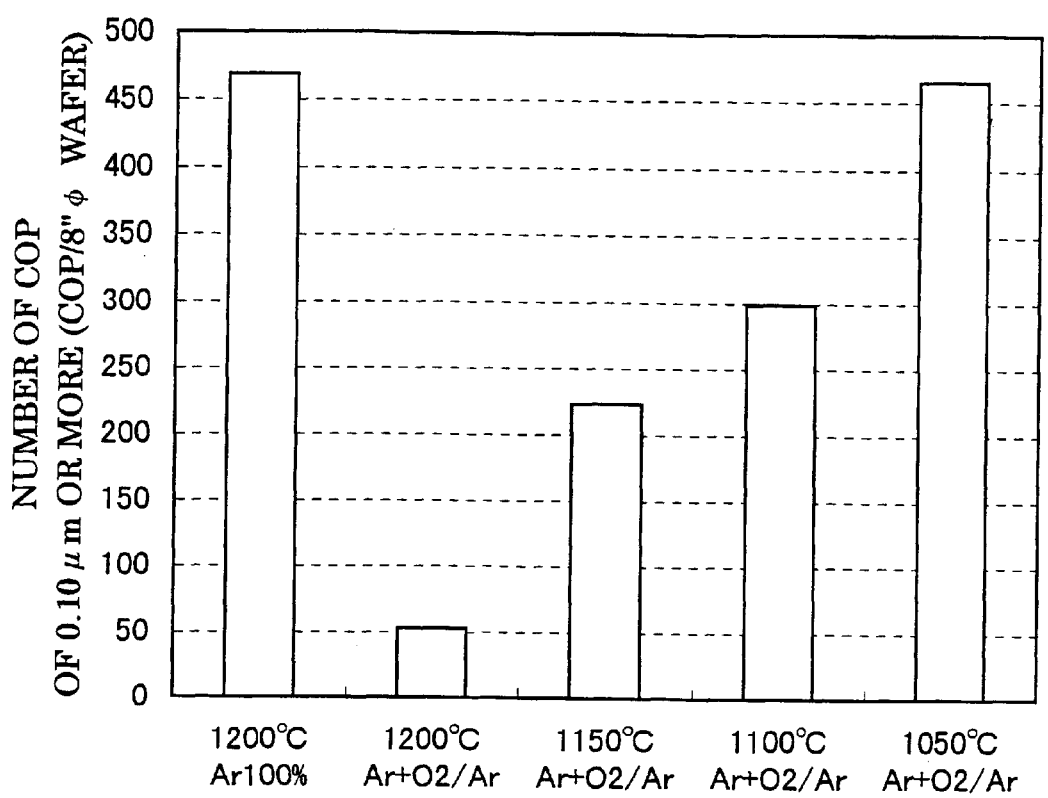
FIG. 9 shows comparison of surface COP densities measured for the surfaces after polishing of 5 $\mu$m of wafers subjected to a heat treatment under a non-oxidative atmosphere and then subjected to a heat treatment under an oxidative atmosphere at different heat treatment temperatures, and a wafer subjected to a heat treatment under a non-oxidative atmosphere in Example 4 and Comparative Example 4.

Ar at each of four kinds of temperature level, 1200° C., 1150° C., 1100° C. and 1050° C., or subjected to annealing at 1200° C. for 1 hour in a 100% Ar atmosphere. The results of comparison for COP densities of the surfaces after polishing of 5 μm from the surfaces are shown in FIG. 9.

From the results shown in the figure, it can be seen that the COP eliminating effect in a region to a depth of at least 5 μm from the surface more excellent than that obtained only with Ar annealing at 1200° C. is obtained at a temperature higher than 1050° C., and the COP density as for a COP size of 0.10 μm or more in a region to a depth of at least 5 μm from the surface can be 1.0 COP/cm² or less (300 COPs/8 inch wafer or less) at a temperature of 1100° C. or higher. It is also possible to obtain a COP density of 0.16 COP/cm² or less (50 COPs/8 inch wafer or less) at a temperature of 1200° C. or higher.

The above results indicate that it is possible to obtain quality comparable to or higher than conventionally obtained quality even when the temperature is lowered from the conventionally used temperature, and it can be said that it is an annealing method extremely effective for wafers likely to contain crystal defects such as slip dislocations, for example, wafers having a large diameter of 300 mm or more.

EXAMPLE 5
and

Comparative Example 5

CZ wafers obtained from a single crystal ingot pulled under the same conditions as in Example 3 and Comparative Example 3 were subjected to annealing at a heat treatment temperature of 1200° C. for 60 minutes under a 100% Ar atmosphere, then cooled to a predetermined retention temperature, and maintained in dry $O_2$ changed form Ar for 30 minutes. As the retention temperature, five kinds of temperature levels, 900° C., 850° C., 800° C., 750° C. and 700° C., were used. The wafers were introduced and taken out at a temperature of 700° C. (Example 5). For comparison, a wafer was subjected to annealing at 1200° C. for 60 minutes under a 100% Ar atmosphere, then cooled to 700° C., and maintained in $N_2$ changed form Ar for 30 minutes (Comparative Example 5).

Figure 10:
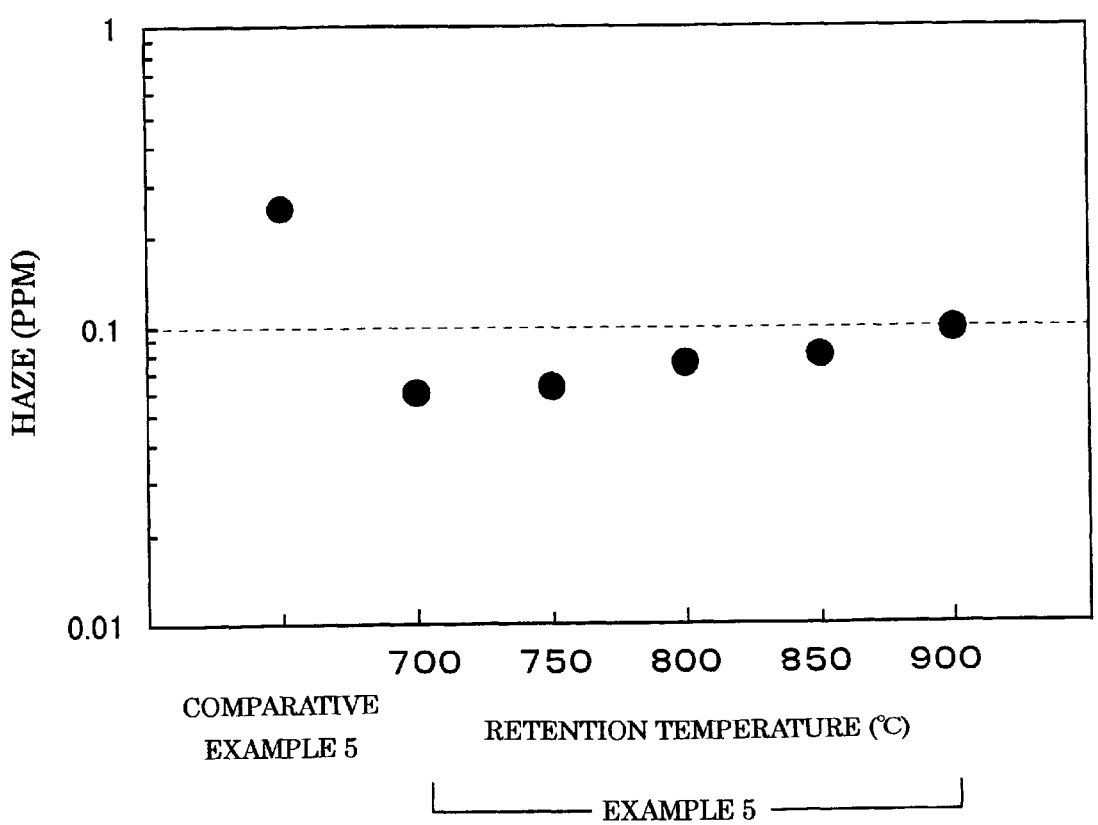
FIG. 10 shows comparison of haze measured for wafers subjected to a heat treatment under a non-oxidative atmosphere and then subjected to a heat treatment under an oxidative atmosphere at different heat treatment temperatures, and a wafer subjected to a heat treatment under a non-oxidative atmosphere in Example 5 and Comparative Example 5.

Surface roughness (haze and microroughness) of the wafer surfaces was measured for these 6 kinds of wafers. The haze measurement was performed by using SurfScan SP1 produced by KLA Tencor, and the measured values obtained in the Dark Wide mode in the measurement apparatus. The results of the measurement are shown in FIG. 10. The unit ppm for the axis of ordinate in FIG. 10 represents the ratio of scattered light intensity to an incident light. The results shown in FIG. 10 show that the haze level of the wafer of this example was improved to 0.1 ppm or less.

Because oxide films were formed on the five kinds of the wafers of Example 5, the measurement was performed after removing the oxide films with an aqueous solution of HF.

Further, the microroughness of the wafers of Example 5 was measured by using NanoScope-II produced by Digital Instrument as a P–V value in an area of 2 μm square. As a result, all of the wafers showed a value of 1.0 nm or less. Therefore, it was found to be improved even when the values was compared with a P–V value of usual mirror surface wafers not subjected to the heat treatment of this example (1.3 nm).

Moreover, it was found that the wafer of Comparative Example 5 had a nitride film having a thickness of about 1.5 nm on its surface due to the nitrogen substitution. It was expected that particles became likely to adhere to the wafer surface because a nitride film had a high dielectric constant. Therefore, this wafer and a wafer produced under the same conditions as in Example 5 (oxide film was not removed) were stored in a wafer case for 2 months, and then particles (size of 0.1–0.2 μm) on the wafers was measured. As a result, the wafer of Example 5 showed increase of particles on the wafers of 100 particles/wafer in average, whereas the wafer of Comparative Example 5 showed that of 2000 particles/wafer.

Therefore, it can be seen that the wafer of the present invention exhibits an excellent effect also in view of protection of wafer surface from the adhesion of particles.

The present invention is not limited to the embodiments described above. The above-described embodiments are mere examples, and those having the substantially same structure as that described in the appended claims and providing the similar functions and advantages are included in the scope of the present invention.

For example, when a silicon single crystal ingot with or without nitrogen doping is grown by the Czochralski method according to the present invention, the melt may be or may not be applied with a magnetic field. That is, the Czochralski method used for the present invention includes the so-called MCZ method wherein a magnetic field is applied to the melt.

Further, the heat treatment at an elevated temperature under a non-oxidative atmosphere and the heat treatment under an oxidative atmosphere, which constitute the essential characteristics of the present invention, can be applied in any process steps in the wafer processing steps. For example, the heat treatment of the present invention can be performed after the chemical etching step following slicing of wafers, the rough polishing step which is a step subsequent to the chemical etching, the last polishing step and so forth.

Furthermore, although the heat treatment under a non-oxidative gas atmosphere of the present invention was explained in the above embodiments mainly for the cases utilizing argon or nitrogen gas, the atmosphere is not necessarily limited to argon or nitrogen gas. A gas containing a small amount of hydrogen less than the lower explosion limit in the above gases, noble gases such as helium, neon, krypton and xenon and so forth may also be used so long as they have the same effect as argon, and they fall within the scope of the present invention.

Noble gases other than argon can be used also for the heat treatment under an atmosphere of a mixed gas of argon and nitrogen.

What is claimed is:

1. A method for producing a silicon single crystal wafer, which comprises growing a silicon single crystal ingot by the Czochralski method, slicing the single crystal ingot into a wafer, subjecting the wafer to a heat treatment at a temperature of 1100–1300° C. for 1 minute or more under a non-oxidative atmosphere, and successively subjecting the wafer to a heat treatment at temperature of 700–1300° C. for 1 minute or more under an oxidative atmosphere without cooling the wafer to a temperature lower than 700° C.

2. The method for producing a silicon single crystal wafer according to claim 1, wherein the non-oxidative atmosphere is argon, nitrogen or a mixed gas of argon and nitrogen.

3. The method for producing a silicon single crystal wafer according to claim 2, wherein, when the silicon single crystal ingot is grown by the Czochralski method, cooling rate of the single crystal ingot between 1150–1080° C. is controlled to be at 2.3° C./min or more.

4. The method for producing a silicon single crystal wafer according to claim 2, wherein, when the silicon single crystal ingot is grown by the Czochralski method, oxygen concentration in the single crystal ingot is controlled to be 18 ppma or less.

5. A silicon single crystal wafer produced by the method according to claim 2.

6. The method for producing a silicon single crystal wafer according to claim 1, wherein an oxide film is preliminarily formed on the wafer surface before performing the heat treatment under a non-oxidative atmosphere.

7. The method for producing a silicon single crystal wafer according to claim 6, wherein thickness of a thermal oxide film formed on the wafer surface after the heat treatment under an oxidative atmosphere is controlled to be 300 nm or more.

8. The method for producing a silicon single crystal wafer according to claim 7, wherein, when the silicon single crystal ingot is grown by the Czochralski method, cooling rate of the single crystal ingot between 1150–1080° C. is controlled to be at 2.3° C./min ore more.

9. The method for producing a silicon single crystal wafer according to claim 1, wherein thickness of an oxide film formed by the heat treatment under the oxidative atmosphere is controlled to be 20–100 nm.

10. The method for producing a silicon single crystal wafer according to claim 1, wherein the oxidative atmosphere is an atmosphere containing water vapor.

11. The method for producing a silicon single crystal wafer according to claim 10, wherein, when the silicon single crystal ingot is grown by the Czochralski method, cooling rate of the single crystal ingot between 1150–1080° C. is controlled to be at 2.3° C./min or more.

12. Method for producing a silicon single crystal wafer according to claim 10, wherein, when the silicon single crystal ingot is grown by the Czochralski method, the silicon single crystal ingot is doped with nitrogen.

13. The method for producing a silicon single crystal wafer according to claim 12, wherein, when the silicon single crystal ingot doped with nitrogen is grown by the Czochralski method, nitrogen concentration doped in the single crystal ingot is controlled to be $1 \times 10^{10}$ to $5 \times 10^{15}$ atoms/cm$^3$.

14. The method for producing a silicon single crystal wafer according to claim 10, wherein, when the silicon single crystal ingot is grown by the Czochralski method, the silicon single crystal ingot is doped with nitrogen.

15. The method for producing a silicon single crystal wafer according to claim 14, wherein, when the silicon single crystal ingot doped with nitrogen is grown by the Czochralski method, nitrogen concentration doped in the single crystal ingot is controlled to be $1 \times 10^{10}$ to $5 \times 10^{15}$ atoms/cm$^3$.

16. The method for producing a silicon single crystal wafer according to claim 10, wherein, when the silicon single crystal ingot is grown by the Czochralski method, oxygen concentration in the single crystal ingot is controlled to be 18 ppma or less.

17. A silicon single crystal wafer produced by the method according to claim 10.

18. The method for producing a silicon single crystal wafer according to claim 1, wherein the oxidative atmosphere is a dry oxygen atmosphere or a mixed gas atmosphere of dry oxygen and argon or nitrogen.

19. The method for producing a silicon single crystal wafer according to claim 1, wherein, when the silicon single crystal ingot is grown by the Czochralski method, oxygen concentration in the single crystal ingot is controlled to be 18 ppma or less.

20. A silicon single crystal wafer produced by the method according to claim 1.

21. The method for producing a silicon single crystal wafer according to claim 1, wherein, when the silicon single crystal ingot is grown by the Czochralski method, the silicon single crystal ingot is doped with nitrogen.

22. The method for producing a silicon single crystal wafer according to claim 21, wherein, when the silicon single crystal ingot doped with nitrogen is grown by the Czochralski method, nitrogen concentration doped in the single crystal ingot is controlled to be $1 \times 10^{10}$ to $5 \times 10^{15}$ atoms/cm$^3$.

23. A CZ silicon single crystal wafer, wherein density of COPs having a size of 0.09 $\mu$m or more in a surface layer having a thickness of up to 5 $\mu$m from a surface is 1.3 COPs/cm$^2$ or less, and density of COPs having a size of 0.09 $\mu$m or more in a bulk portion other than the surface layer is larger than the density of COPs of the surface layer.

24. A CZ silicon single crystal wafer according to claim 23, which has haze on a wafer surface of 0.1 ppm or less, and microroughness in a measurement area of 2 $\mu$m square of 1.0 nm or less in terms of P–V value.

* * * * *